(12) United States Patent
Sugiyama et al.

(10) Patent No.: US 7,440,482 B2
(45) Date of Patent: *Oct. 21, 2008

(54) NITRIDE SEMICONDUCTOR LASER ELEMENT AND METHOD FOR MANUFACTURING THE SAME

(75) Inventors: Takafumi Sugiyama, Komatsushima (JP); Eiji Sakaguchi, Tokushima (JP); Masaki Yoshida, Anan (JP)

(73) Assignee: Nichia Corporation, Anan-shi (JP)

( * ) Notice: Subject to any disclaimer, the term of this patent is extended or adjusted under 35 U.S.C. 154(b) by 19 days.

This patent is subject to a terminal disclaimer.

(21) Appl. No.: 11/585,164

(22) Filed: Oct. 24, 2006

(65) Prior Publication Data

US 2007/0121691 A1    May 31, 2007

(30) Foreign Application Priority Data

Nov. 1, 2005   (JP)   ............................. 2005-318196

(51) Int. Cl.
*H01S 5/00*   (2006.01)
(52) U.S. Cl. .................................. 372/43.01; 372/46.01
(58) Field of Classification Search ............. 372/46.01, 372/45.01, 50.21, 50.1, 75
See application file for complete search history.

(56) References Cited

U.S. PATENT DOCUMENTS

| 6,597,716 B1 * | 7/2003 | Takatani ................... 372/46.01 |
| 2002/0110945 A1 * | 8/2002 | Kuramata et al. ............. 438/36 |
| 2005/0111506 A1 * | 5/2005 | Ohta et al. ..................... 372/46 |
| 2005/0218414 A1 * | 10/2005 | Ueda et al. .................... 257/94 |
| 2007/0290230 A1 * | 12/2007 | Kawaguchi et al. ......... 257/196 |

FOREIGN PATENT DOCUMENTS

| JP | H10-270792 A | 10/1998 |
| JP | 2005-158941 A | 6/2005 |
| JP | 2005-166718 A | 6/2005 |

* cited by examiner

*Primary Examiner*—Minsun Harvey
*Assistant Examiner*—Tuan N. Nguyen
(74) *Attorney, Agent, or Firm*—Global IP Counselors, LLP

(57) ABSTRACT

A nitride semiconductor laser element, comprises a substrate, a nitride semiconductor layer laminated over said substrate and having a ridge on its surface, and an electrode, wherein a first protective film is formed so that an air gap is located on at least part of the region extending from the side of the ridge to the surface of the nitride semiconductor layer on both sides of said ridge.

19 Claims, 6 Drawing Sheets

NITRIDE SEMICONDUCTOR LASER ELEMENT AND METHOD FOR MANUFACTURING THE SAME

BACKGROUND OF THE INVENTION

1. Field of the Invention

The present invention relates to a nitride semiconductor laser element and to a method for manufacturing this element, and more particularly relates to a nitride semiconductor laser element having a ridge waveguide structure, and to a method for manufacturing this element.

2. Description of the Prior Art

There is a growing need for semiconductor laser elements featuring a nitride semiconductor formed from a compound semiconductor of $In_xAl_yGa_{1-x-y}N$ ($0 \leq x$, $0 \leq y$, $0 \leq x+y \leq 1$) to be utilized in optical disk systems that allow large-capacity and high-density information recording and reproduction, such as next-generation DVDs, and to be utilized in personal computers and other such electronic devices. Accordingly, a great deal of research has gone into semiconductor laser elements that make use of nitride semiconductors.

Also, because semiconductor laser elements made from a nitride semiconductor are believed to be capable of oscillation over a wide wavelength range of visible light, from the ultraviolet band to red, they hold promise for application in many diverse fields, such as light sources for optical networks and the like, laser printers, and so forth.

In particular, various research as been aimed at laser element structures, the result of which is that a structure which allows favorable lateral mode control, a structure that affords reduced power consumption, higher output, better reliability, a smaller size, a longer service life, and so forth, and other such structures have been proposed. Of these, the structures that are viewed as the most promising are those having a ridge waveguide structure, and this ridge waveguide structure has even been employed in nitride semiconductor laser elements, which were the world's first to appear on the market.

Also, further threshold current reductions are needed for nitride semiconductor laser elements. Reducing the threshold of a laser element requires that the horizontal-lateral mode be stabilized.

Usually, with a laser element featuring a ridge waveguide structure, optical confinement in the lateral mode must be carried out with good control and reproducibility in order to stabilize the horizontal-lateral mode, and a known way of accomplishing this is to use a protective film with a low refractive index as an embedding film.

For example, there has been proposed a compound semiconductor laser capable of lateral mode control, in which an embedding layer composed of a dielectric film is formed on both sides of a ridge component (see Japanese Laid-Open Patent Application H10-270792, for example).

There has also been proposed a laser element comprising a ridge composed of a second cladding layer of a second conduction type and a cap layer of a second conduction type, a dielectric film formed on the side faces of the ridge except for the very top part of the ridge, and an electrode metal layer that covers the ridge, wherein there is a cavity between the dielectric film or electrode metal layer and the subsequently formed thick-film electrode, in the upper face portion of the ridge (see Japanese Laid-Open Patent Application 2005-166718, for example).

However, the optical confinement of a laser element in which a protective film with a low refractive index is formed on the side faces of the ridge and on the surface of the nitride semiconductor layer on both sides of the ridge depends on the material of this protective film.

Also, it was difficult to control optical confinement in the horizontal-lateral mode because it affected the adhesion and thickness of the protective film formed on the semiconductor laser on both sides of the ridge.

With the structure described in Japanese Laid-Open Patent Application H10-270792, for example, the embedding layer is formed in a thickness that is equal to the height of the upper surface of the ridge from the exposed part of the semiconductor laser, so a difference in the coefficients of thermal expansion between the semiconductor laser and the embedding layer may result in interfacial separation between the embedding layer and the semiconductor laser, which leads to current leakage. There is also the danger than cracks will develop in the embedding layer and that current will leak from these cracks.

With the semiconductor laser element described in Japanese Laid-Open Patent Application 2005-166718, there is an air gap on the outside of the dielectric film formed on the side faces of the ridge, so lateral mode control is unlikely to be possible. Furthermore, since this semiconductor laser element is a GaAs-based semiconductor element, it has an eave-like shape, but with a nitride semiconductor the ridge shape tends to be difficult to form in an eave shape.

SUMMARY OF THE INVENTION

The present invention was conceived in light of the above situation, and it is an object thereof to provide a nitride semiconductor laser element with a threshold that is lowered by stabilizing the lateral mode of a nitride semiconductor laser, and to provide a method for manufacturing this element.

The present invention provides a nitride semiconductor laser element, comprising a substrate, a nitride semiconductor layer laminated over said substrate and having a ridge on its surface, and an electrode, wherein a first protective film is formed so that an air gap is located on at least part of the region extending from the side of the ridge to the surface of the nitride semiconductor layer on both sides of said ridge.

Also, the present invention provides a nitride semiconductor laser element, comprising a substrate, a nitride semiconductor layer laminated over said substrate and having a ridge on its surface, and an electrode, wherein a first protective film and an electrode are formed in this order via an air gap, on the surface of the nitride semiconductor layer on both sides of the ridge.

Further, the present invention provides a method for manufacturing a nitride semiconductor laser element, comprising the steps of:

forming a nitride semiconductor layer over a substrate;

forming a first mask pattern over said nitride semiconductor layer and using said first mask pattern for etching, thereby forming a ridge;

forming a second mask pattern on both sides of the ridge;

forming a first protective film over the nitride semiconductor layer exposed after the formation of the first mask pattern, the second mask pattern, and the ridge; and removing the first protective film present on the first mask pattern, the first mask pattern, and the second mask pattern, thereby forming an air gap in at least part of the region extending from both sides of the ridge to the surface of the nitride semiconductor layer on both sides of the ridge.

With the present invention, an air gap is formed on both sides of a ridge, which stabilizes optical confinement and allows horizontal-lateral mode control, so the threshold can be lowered. This affords a further reduction in power consumption and a longer service life.

Also, with the present invention, an air gap can be formed with good control on both sides of a ridge, allowing a high-performance nitride semiconductor laser element to be manufactured very simply.

DETAILED DESCRIPTION

The nitride semiconductor laser element of the present invention mainly comprises a substrate, a nitride semiconductor layer, an electrode, and a first protective film.

Figure 1:
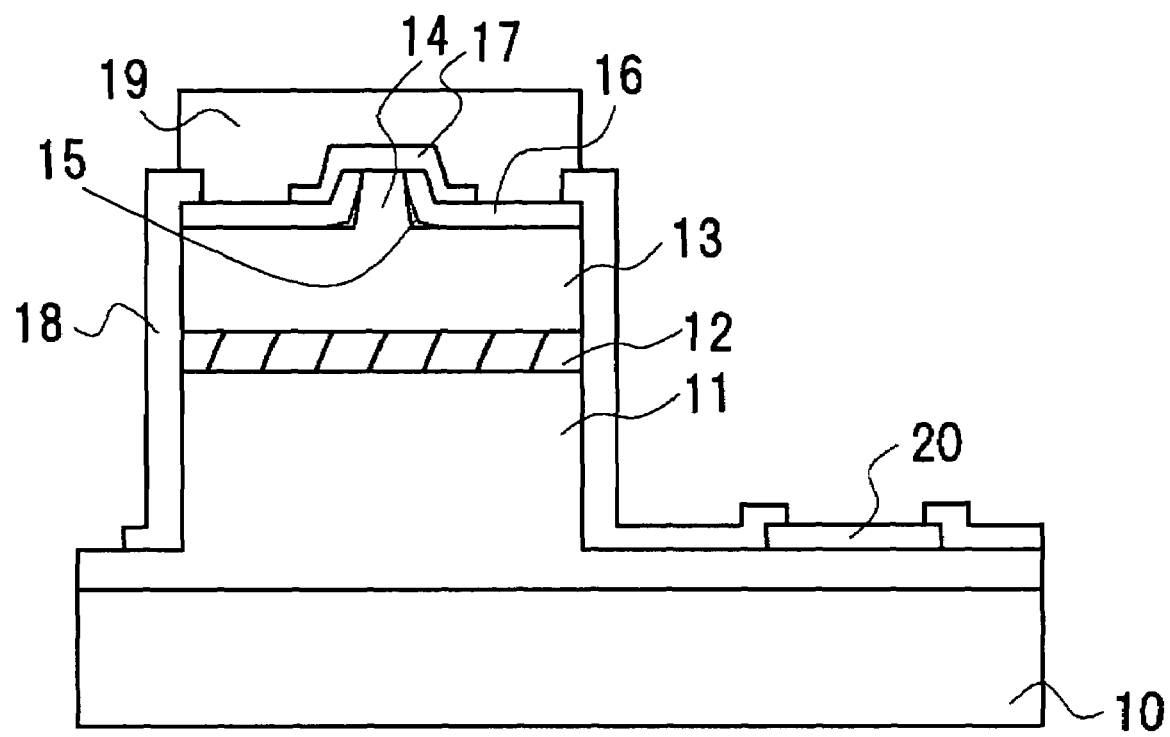
FIG. 1 is a simplified cross-sectional view of the main components of the nitride semiconductor laser element of the present invention, and illustrates the structure thereof.
Figure 6A:
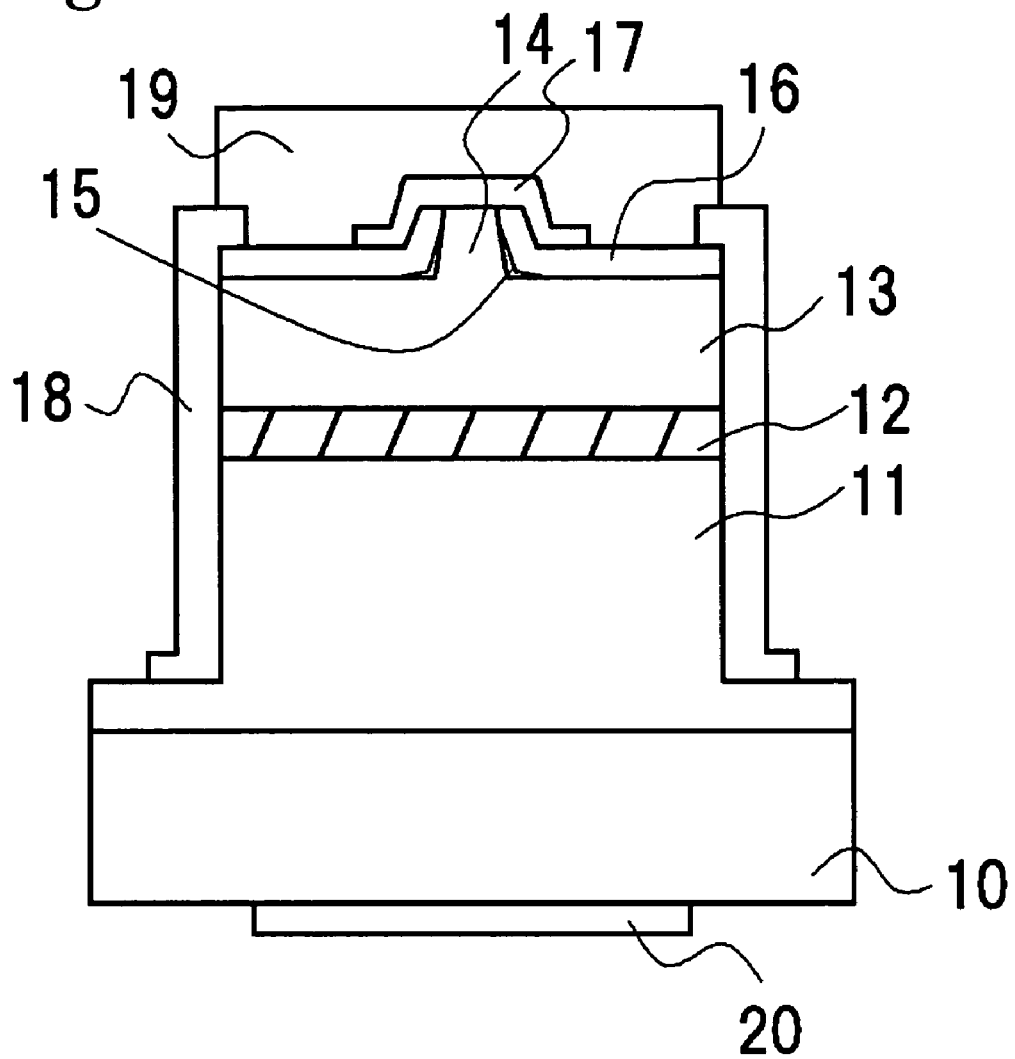
FIGS. 6a and 6b are simplified cross-sectional views of the main components of another nitride semiconductor laser element of the present invention, and illustrates the structure thereof.

As shown in FIG. 6a, for example, an n-type semiconductor layer 11, an active layer 12, and a p-type semiconductor layer 13 are formed in that order as nitride semiconductor layers on a substrate 10 having two main faces. A ridge 14 is formed on the surface of a nitride semiconductor, and a first protective film 16 is formed on the surface of the nitride semiconductor layer so that an air gap 15 is disposed from the side faces of the ridge 14 to the surface of the nitride semiconductor layer. A p-electrode 17 is formed on the top side of the ridge 14, and an n-electrode 20 is formed on the bottom side of the substrate 10. Also, the p-electrode 17 and the n-electrode 20 may be formed on the top side of the substrate as shown in FIG. 1.

The nitride semiconductor laser element of the present invention is preferably such that the first protective film and the electrode are formed in that order on the surface of the nitride semiconductor layer on both sides of the ridge, via an air gap. Because the electrode formed on the ridge is thus continuous on the first protective film as well, the first protective film and the nitride semiconductor layer including the ridge will not separate at their interface as much. Also, since the first protective film and the electrode are formed via an air gap, optical absorption by the electrode can be suppressed.

With the present invention, the substrate may be either an insulating substrate or a conductive substrate. In the case of an insulating substrate, part of the nitride semiconductor layer may be removed in the thickness direction to form an n-electrode so that it is in contact with the n-type semiconductor layer.

The nitride semiconductor layer is represented by the general formula $In_xAl_yGa_{1-x-y}N (0 \leq X \leq 1, 0 \leq y \leq 1, 0 \leq x+y \leq 1)$. In addition, B may be partially included as a group III element. Further, N (group V element) may be partly substituted with P or As. The n-type nitride semiconductor layer contains, as n-type dopants, at least one group VI or IV element such as Si, Ge, Sn, S, O, Ti, Zr, Cd and the like. Further, the p-type nitride semiconductor layer contains, as p-type dopants, Mg, Zn, Be, Mn, Ca, Sr and the like. It is preferable that dopant concentration be within a range of $5 \times 10^{16}/cm^3$ or more and $1 \times 10^{21}/cm^3$ or less. The semiconductor layer may have a single layer, but homostructures having MIS junctions, PIN junctions, or PN junctions or the like, heterostructures, and double heterostructures are preferably used. Furthermore, a multilayer laminate structure or an ultra lattice structure are also acceptable, in particular, for an active layer, it is prefer a single quantum well structure or a multiquantum well structure laminated as a thin film which generates quantum effects.

It is preferable that the nitride semiconductor layer be configured in an SCH (Separate Confinement Heterostructure) structure in which an active layer is sandwiched between the n-type nitride semiconductor layer and p-type nitride semiconductor layer, and in which optical guide layers provided with the n-type nitride semiconductor layer and p-type nitride semiconductor layer, respectively, constitute an optical waveguide.

There are no particular restrictions on the method for growing the nitride semiconductor, and any known method for growing a nitride semiconductor, such as MOVPE (metalorganic vapor phase epitaxy), MOCVD (metalorganic chemical vapor deposition), HVPE (hydride vapor phase epitaxy), or MBE (molecular beam epitaxy), can be used preferably. The method for growing the nitride semiconductor is preferably selected as dictated by the intended use, however, MOCVD is preferable because it allows the nitride semiconductor to be growth with good crystallinity.

The ridge is formed on the surface of the nitride semiconductor layer, that is, the p-type semiconductor layer. The ridge functions as a waveguide region, and its width is preferably about 1.0 to 30.0 μm, and even more preferably about 1.0 to 3.0 μm. Its height (the depth of etching) can be suitably adjusted according to the thickness, material, etc., of the layer constituting the p-type semiconductor layer, but an example is from 0.1 to 2 μm. The ridge is preferably designed so that its length in the resonator direction will be about 100 to 1000 μm. All of the ridge may have the same width in the resonator direction, and its side faces may be vertical or tapered. If they are tapered, the taper angle is preferably about 45 to 90°.

The air gap is disposed in at least part of the region extending from the side faces of the ridge to the surface of the nitride semiconductor layer on both sides of the ridge. The air gap is bounded by the first protective film covering the surface of the nitride semiconductor layer including the ridge. Therefore, the air gap is preferably in a stripe pattern corresponding to the shape of the ridge. The reason for this is that optical confinement will be more uniform over the entire region of the ridge in the stripe direction. However, the air gap need not be disposed uniformly in the stripe direction of the ridge, and may instead have a varying width and/or height, or a plurality of air gaps may be disposed separately in the stripe direction.

The air gap is preferably such that its height $h_1$ is at least ⅕₀ and less than 1, and more preferably at least ⅕ and less than 1, with respect to the height $h_2$ of the ridge. The width of the air gap is preferably about equal to or less than the ridge width, and more specifically, is about 100 Å to about 3 μm, and even more preferably about 1000 to about 5000 Å. The cross sectional area $S_1$ of the air gap perpendicular to the stripe direction of the ridge is about 0.0001 to about 1 μm², and preferably about 0.01 to about 0.05 μm². As shown in FIGS. 5a to 5f, examples of the cross sectional shape of the air gap 15 include rectangular, triangular, and L-shaped, among the various possibilities. With the air gaps 15 having these cross sectional shapes, when the height and width of the air gap 15 are compared, the air gap may be one that is taller (vertical) or one that is wider (horizontal), or one in which the height and width are about the same. A horizontal air gap whose width is greater than its height is particularly effective at suppressing the optical absorption of the electrode. A vertical air gap whose height is greater than its width is particularly effect at optical confinement within the ridge. Because of this, it is preferable to provide an L-shaped air gap that achieves both of these effects, namely, suppressing the optical absorption of the electrode and optical confinement within the ridge.

If this air gap is disposed between the ridge and the first protective film, light can be more efficiently confined within the ridge because of the difference in the refractive indexes of the air gap and the ridge. That is, air has relatively small refractive index (1.0), so compared to when there is no air gap between the ridge and the first protective film (when optical is confined by refractive index differential of the ridge and the protective film), the refractive index differential inside and outside the ridge is greater and optical confinement within the ridge can be increased. Furthermore, having an air gap reduces the effect of the change in refractive index caused by the annealing of the first protective film, so light can be stably confined in the lateral direction. This affords a lower threshold and allows power consumption to be decreased and the service life to be extended.

The first protective film may be formed over the surface of the nitride semiconductor layer and the side faces of the ridge so that an air gap can be formed. This film can be formed, for example, from an insulating material with a lower refractive index than the nitride semiconductor layer. Specific examples include one or more layers of oxides, nitrides, or the like of Zr, Si, V, Nb, Hf, Ta, Al or the like. Thus forming the first protective film from the side faces of the ridge to the nitride semiconductor surface on both sides of the ridge ensures a refractive index differential with respect to the nitride semiconductor layer, and particularly, the p-type semiconductor layer, which suppresses the leakage of light from the active layer, allows light to be confined more efficiently in the ridge, ensures better insulation near the bottom of the ridge, and avoids the occurrence of leak current. There are no particular restrictions on the thickness of the first protective film, but one whose thickness is about 100 Å to about 20000 Å is preferable, with about 100 to about 5000 Å being even better.

Figure 4:
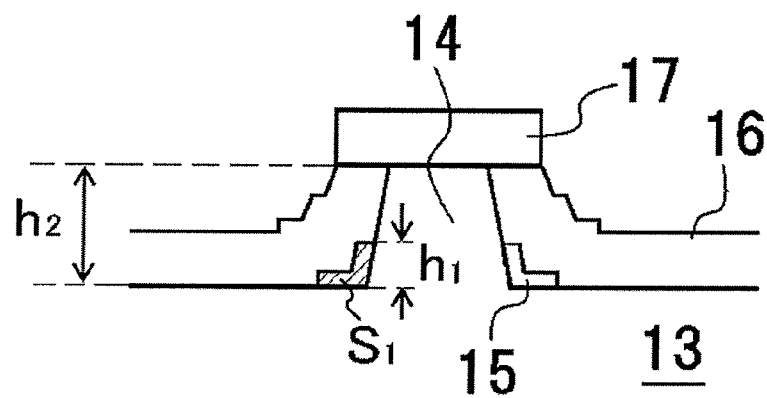
FIG. 4 is a simplified cross-sectional view of the main components of the nitride semiconductor laser element of the present invention, and illustrates the electrode shape thereof.
Figure 5A:
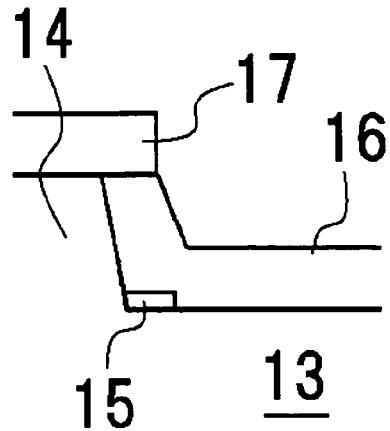
FIG. 5a to 5f are simplified cross-sectional view of the main components of the nitride semiconductor laser elements of the present invention, and illustrates the air gap shape thereof.
Figure 5B:
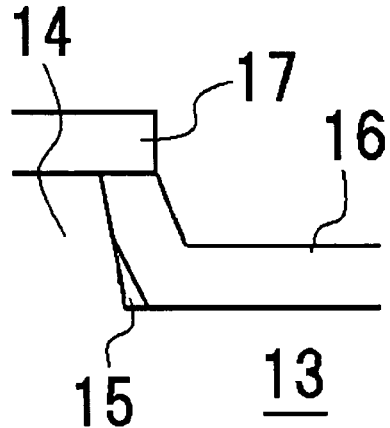
Figure 5C:
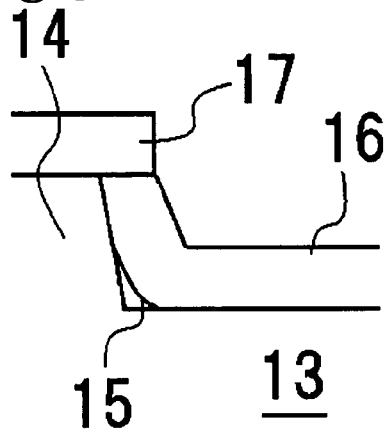
Figure 5D:
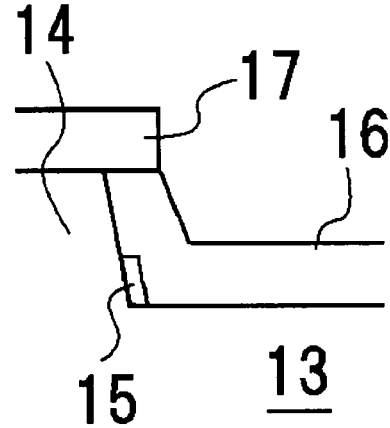
Figure 5E:
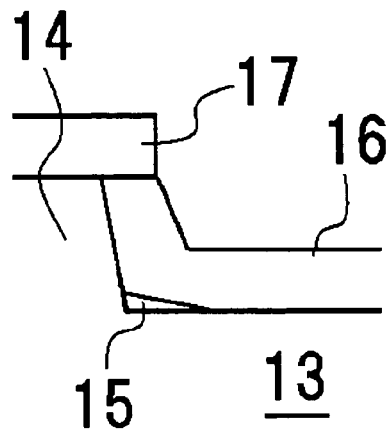
Figure 5F:
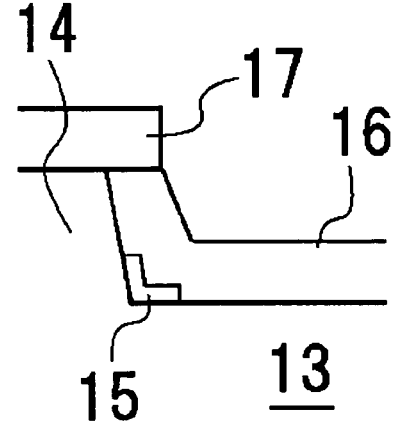

As shown in FIG. 4, the electrode 17 in the present invention is preferably formed over the semiconductor layer 13 and the first protective film 16. The separation (i.e., peeling) of the first protective film can be prevented by forming the electrode continuously over the first protective film and the nitride semiconductor layer (uppermost layer). As shown in FIGS. 1 and 6a, forming the electrode 17 up to the ridge 14 side faces is particularly effective for the first protective film 16 formed on the ridge 14 side faces. Also, since the first protective film 16 and the electrode 17 are formed via the air gap 15, optical absorption by the electrode can be suppressed.

The term "electrode" here means a pair of electrodes, that is, a p-electrode and an n-electrode. The electrode can be formed of one or more layers of metals or alloys of Pd, Pt, Ni, Au Ti, W, Cu, Ag, Zn, Sn, In, Al, Ir Rh, ITO or the like. The film thickness of the electrode can be suitably adjusted according to the material used and so forth, but about 500 to about 5000 Å is suitable, for example. The electrodes may be formed at least on the p-type and n-type semiconductor layers or the substrate, and one or more conductive layers such as a pad electrode may be formed over this electrode.

A second protective film may also be formed over the first protective film. The second protective film may be disposed over the first protective film on at least the nitride semiconductor layer surface, and preferably covers the side faces of the nitride semiconductor layer and/or the side faces of the substrate, or further covers the surface or the like, with or without the first protective film being interposed. The second protective film can be formed from the same material as the first protective film. This not only affords better insulation, but also more effectively protects the exposed side faces, surface, etc.

With the method of the present invention for manufacturing a nitride semiconductor laser element, first, a nitride semiconductor layer is formed over a substrate.

An example of this substrate is a nitride semiconductor substrate having an off angle of, for example, at least 0° and no more than 10° on its first main face and/or second main face. The thickness of the substrate is at least 50 μm and no more than 10 mm, more preferably at least 100 μm and no more than 1000 μm. A nitride semiconductor substrate can be formed by MOCVD, HVPE, MBE, or another such vapor phase growth method, or by a melt process, flow process, high-pressure process, or hot water synthesis process in which crystals are grown in a supercritical fluid, or the like. A commercially available substrate may also be used.

A nitride semiconductor layer is grown on the first main face of this nitride semiconductor substrate.

The nitride semiconductor layer is grown by growing an n-type semiconductor layer, an active layer, and a p-type semiconductor layer in that order by MOCVD, for example, under either reduced pressure or atmospheric pressure. The n-type semiconductor layer and p-type semiconductor layer may have a single-film structure, a multilayer film structure, or a super-lattice structure comprising of two layers with different compositional ratios.

The n-type semiconductor layer preferably is formed by a multilayer film. For instance, the first n-type semiconductor layer may be $Al_xGa_{1-x}N$ ($0 \leq x \leq 0.5$), preferably $Al_xGa_{1-x}N$ ($0 \leq x \leq 0.3$). A specific example of growth conditions is one in which the growth temperature inside the reaction furnace is at least 1000° C. and the pressure is no higher than 600 Torr. Also, the first n-type semiconductor layer can function as a cladding layer. The thickness of the first n-type semiconductor layer may be about 0.5 to about 5 μm. The second n-type semiconductor layer can function as a light guide layer, and can be formed from $Al_xGa_{1-x}N$ ($0 \leq x \leq 0.3$). The thickness of the second n-type semiconductor layer may be about 0.05 to about 5 μm, suitably about 0.5 to about 5 μm.

The active layer preferably contains at least indium (In) and has a general formula of $In_xAl_yGa_{1-x-y}N$ ($0 \leq x \leq 1$, $0 \leq y \leq 1$, $0 \leq x+y \leq 1$). Light can be emitted in the UV band by raising the aluminum content. Light can also be emitted on the longer wavelength side, with emission from 360 to 580 nm being possible. The light emission efficiency can be enhanced by forming the active layer from a quantum well structure.

The p-type semiconductor layer is laminated over the active layer. The first p-type semiconductor layer can be formed from $Al_xGa_{1-x}N$ ($0 \leq x \leq 0.5$) containing a p-type impurity. The first p-type semiconductor layer functions as a p-side electron confinement layer. The second p-type semiconductor layer can be formed from $Al_xGa_{1-x}N$ ($0 \leq x \leq 0.3$), and the third p-type semiconductor layer from $Al_xGa_{1-x}N$ ($0 \leq x \leq 0.5$) containing a p-type impurity. The third p-type semiconductor layer is preferably a super-lattice structure composed of GaN and AlGaN, and functions as a cladding layer. The fourth p-type semiconductor layer can be formed from $Al_xGa_{1-x}N$ ($0 \leq x \leq 1$) containing a p-type impurity. Indium may be included as a mixed crystal in these semiconductor layers. The first p-type semiconductor layer and the second p-type semiconductor layer can be omitted. The suitable thickness of each layer is about 30 Å to about 5 μm.

Optionally, the nitride semiconductor layer may be etched to expose an n-type semiconductor layer (such as the first n-type semiconductor layer). This exposure can be accomplished, for example, by RIE using $Cl_2$, $CCl_4$, $BCl_3$, or $SiCl_4$ gas or the like. This allows stress to be relieved. Also, a resonator face can be formed at the same time during the exposure of this n-type semiconductor layer by etching so as to expose an end face perpendicular to the striped waveguide region. However, the formation of the resonator face may instead be performed by a separate step involving cleavage.

After this, the resistance of the p-type semiconductor layer is preferably lowered by annealing the wafer in a reaction vessel at a temperature of at least 700° C. and in a nitrogen atmosphere.

Next, a first mask pattern is formed over the nitride semiconductor layer, and this first mask pattern is used to perform etching and form a ridge.

The first mask pattern can be formed in the desired shape, for example, by using an oxide film such as $SiO_2$ or a nitride such as SiN and employing a known method such as photolithography and etching. The thickness of the first mask is favorably such that the first mask pattern remaining on the ridge after the formation of the ridge can be removed by the lift-off method in a subsequent step. A range of about 0.1 to about 5.0 μm can be used, for example.

As for the conditions in forming the first mask as an $SiO_2$ mask using a CVD apparatus or the like, the $SiH_4$ gas flow is about 1 to about 20 sccm (Standard cc(cm³)/min), and the $N_2O$ gas flow is about 30 to about 300 sccm, and the substrate temperature here is preferably about 200 to about 500° C.

The first mask pattern is preferably etched into the desired shape using RIE or another such method.

After this, a ridge is formed in a striped pattern, for example, by utilizing the first mask pattern to etch the nitride semiconductor layer. This etching can be favorably performed by using RIE and using a chlorine-based gas such as $Cl_2$, $CCl_4$, $SiCl_4$, and/or $BCl_3$. A favorable example of the conditions here includes etching at a $Cl_2$ gas flow of about 5 to about 100 sccm and an $SiC_4$ gas flow of about 10 to about 300 sccm. There are no particular restrictions on the substrate temperature during this etching, but a lower temperature (such as about 60 to about 200° C.) is preferable.

Next, a second mask pattern is formed on both sides of the ridge. An air gap will be formed in a subsequent step in the space and at the location where this second mask pattern has been formed. Therefore, the location, shape, and size of the second mask pattern are suitably determined by taking into account the location, size, etc., of the air gap to be obtained. For instance, the thickness (height) of the second mask may be about 0.1 to about 2.0 μm, and the width about 0.1 to about 35.0 μm.

The second mask pattern can be formed separately in the desired shape after the ridge has been formed, in the same manner as the first mask pattern or by utilizing another known method. Alternatively, the second mask pattern may be formed simultaneously with the formation of the ridge by depositing the product of etching during the formation of the ridge, in the desired regions on both sides of the ridge, and with the material and thickness of the first mask pattern, the etching conditions (such as the type of etching gas, the temperature, and the duration), and so forth suitably adjusted. The process is simpler when the second mask pattern is formed simultaneously with the formation of the ridge. In any case, the first mask pattern is preferably left disposed in the region where it was formed, before and after the formation of the second mask pattern.

As an example of the method for forming the second mask pattern, first, a resist is formed on the nitride semiconductor layer surface about 0.1 to about 3 μm away from the ridge. The thickness of this resist is preferably about 0.5 to about 5 μm.

Next, the second mask pattern composed of $SiO_2$ or the like is formed over the first mask pattern, over the exposed nitride semiconductor layer, and over the resist. Here, it is preferably formed with an ECR apparatus and using a silicon target, at an argon gas flow of about 5 to about 200 sccm and an $O_2$ gas flow of about 1 to about 50 sccm.

After this, The second mask pattern is formed at the location on the ridge where the air gap is to be formed, by removing by lift-off method the resist and the second mask pattern formed over the resist, with a stripper. Here, the second mask pattern is formed over the first mask pattern on the ridge. The thickness of the second mask pattern here is preferably set such that the pattern can be removed by lift-off method in a subsequent step.

The first mask pattern and second mask pattern are preferably formed from the same material here. In this case, if the thickness of the first mask pattern is greater than the thickness of the second mask pattern, then the first protective film and the mask pattern formed over the ridge can be suitably removed in a subsequent step.

Depending on the conditions under which the first protective film is formed, the first protective film can also be formed without first forming the second mask pattern. This simplifies the process.

Figure 7:
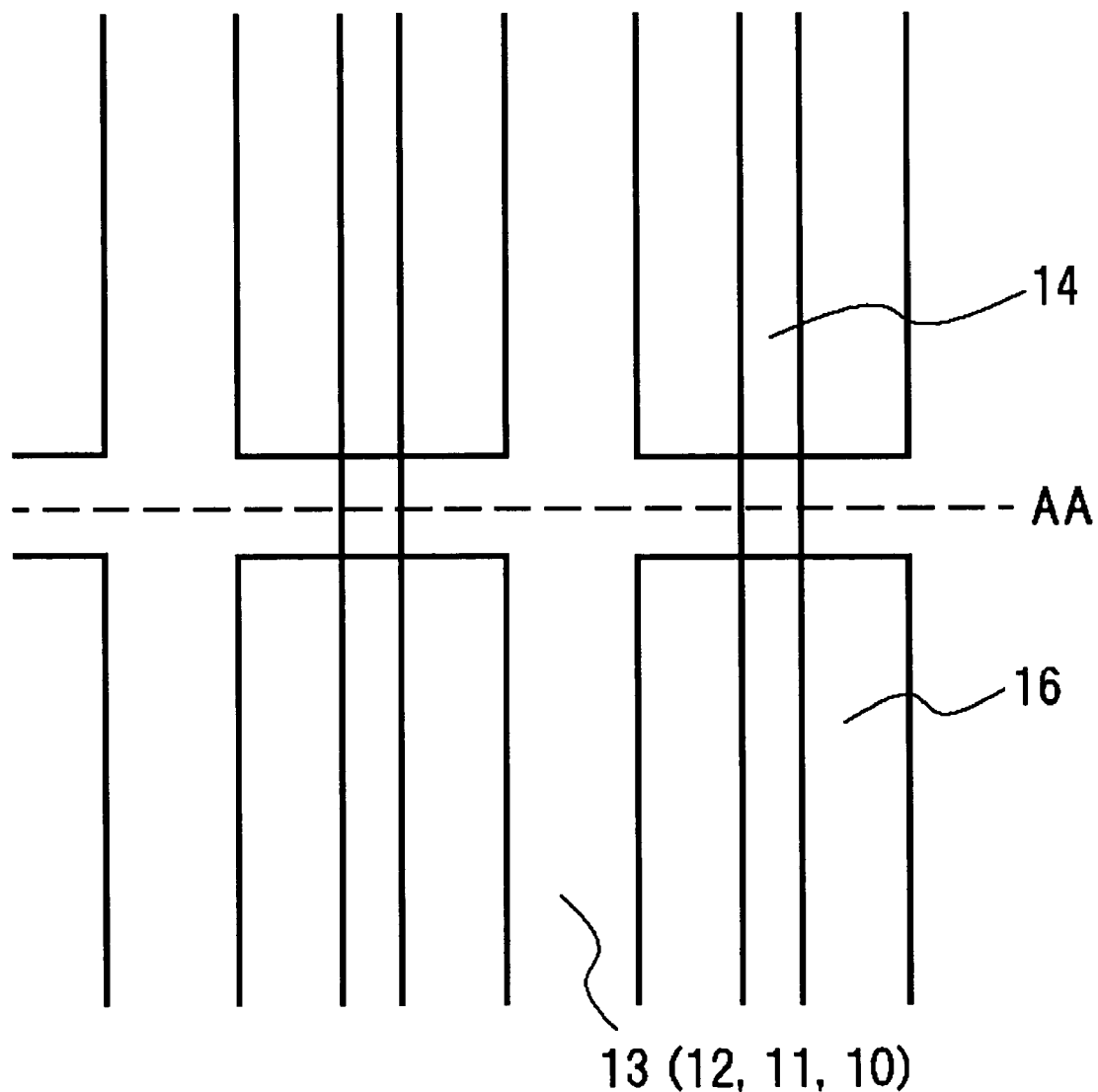
FIG. 7 is a plan view illustrating the shape of the protective film of the nitride semiconductor laser element of the present invention.

Next, the first protective film is formed over the nitride semiconductor layer exposed after the formation of the first mask pattern, the second mask pattern, and the ridge. Any method known in this field can be used to form the first protective film. The thickness of the first protective film is preferably about 100 to about 5000 Å. When a first protective film composed of $ZrO_2$ is formed, for example, it is preferably formed using a zirconium target in a magnetron sputtering apparatus, at an argon gas flow of about 5 to about 200 sccm and an $O_2$ gas flow of about 1 to about 50 sccm. As shown in FIG. 7, for example, the first protective film is preferably formed for every nitride semiconductor laser element, each in the required size (see 16 in FIG. 7).

Next, the first protective film present on the first mask pattern, the first mask pattern, and the second mask pattern are removed. Removing these can be accomplished by a conventional wet or dry etching process. For instance, performing lift-off or wet etching using HF or BHF is suitable. This exposes the surface of the ridge and at the same time removes the second mask pattern, and because of the remaining first protective film, an air gap is disposed in at least part of the region extending from the side faces of the ridge to the surface of the nitride semiconductor layer on both sides of the ridge.

In particular, when the first protective film is formed in the pattern shown in FIG. 7, as discussed above, the etching solution penetrates from the ends of the first protective film 16 and allows the second mask pattern to be removed, and the first protective film, the second mask pattern, and the first mask pattern on the ridge 14 can also be removed.

After this, a p-electrode is formed on the fourth p-type semiconductor layer, which is the surface of the ridge. The p-electrode is preferably formed only on the fourth p-type semiconductor layer. If the p-electrode has a two-layer structure composed of nickel and gold, for example, then first a film of nickel is formed in a thickness of about 50 to about 200 Å over the fourth p-type semiconductor layer, and then a film of gold is formed in a thickness of about 500 to about 3000 Å. If the p-electrode has a three-layer structure, then it is formed in the order of Ni—Au—Pt or Ni—Au—Pd. The nickel and gold may have the same thickness as in a two-layer structure, and the platinum or palladium that serves as the final layer is favorably from about 500 to about 5000 Å.

It is preferable to perform ohmic annealing after the p-electrode has been formed. Suitable annealing conditions include, for example, a temperature of at least 300° C., and preferably at least 500° C., in an atmosphere containing nitrogen and/or oxygen.

Next, a second protective film may be formed over the first protective film. The second protective film can be formed by any method known in this field.

Optionally, a pad electrode may be formed over the p-electrode. This pad electrode is preferably a laminate composed of nickel, titanium, gold, platinum, palladium, tungsten, or another such metal. More specifically, the pad electrode is formed by forming W—Pd—Au or Ni—Ti—Au in that order, starting from the p-electrode side. There are no particular restrictions on the thickness of the pad electrode, but the thickness of the gold film that serves as the final layer is preferably at least 1000 Å.

Also, an n-electrode may be formed over all or part of the second main face of the nitride semiconductor substrate. For example, films of vanadium (about 100 Å thick), platinum (about 2000 Å thick), and gold (about 3000 Å thick) are formed, starting from the substrate side. The n-electrode can be formed, for example, by sputtering, CVD, vapor deposition, or another such method. The lift-off method is preferably used to form the n-electrode, and annealing is preferably performed at 500° C. or higher after the n-electrode has been formed.

A metallized electrode may also be formed over the n-electrode. This metallized electrode may be formed from, for example, Ti—Pt—Au—(Au/Sn), Ti—Pt—Au—(Au/Si), Ti—Pt—Au—(Au/Ge), Ti—Pt—Au—In, Au/Sn, In, Au/Si, Au/Ge, or the like.

After the n-electrode has been formed, it is preferable to divide the wafer into bars in order to form resonator end faces of the nitride semiconductor layer that are perpendicular to the p-electrode stripes. The term resonator end faces here refers to the M plane (1-100) or the A plane (11-20). Methods for diving the wafer into bars include plate breaking, roller breaking, and press breaking.

Also, a reflective mirror may be formed on the resonator end faces. This reflective mirror is a dielectric multilayer film composed of $SiO_2$, $ZrO_2$, $TiO_2$, $Al_2O_3$, $Nb_2O_5$, or the like. The reflective mirror is preferably formed on the light exit face and/or the light reflecting side of the resonance face. It is preferably formed on both the light exit face and the light reflecting side of the resonance face. The reflective mirror can be formed with better reproducibility if the resonance face has been formed by cleavage. Also, the end faces of the air gaps may be covered by this mirror. This prevents dust and so forth from getting into the air gap during laser drive or in subsequent steps, and prevents a drop in the function of the air gap.

The bar-shaped nitride semiconductor substrates can be divided parallel to the electrode stripe direction to produce chips with the nitride semiconductor laser elements.

The nitride semiconductor laser element of the present invention can be utilized in optical disk applications, optical communications systems, printers, exposure applications, measurements, and so forth. This element can also be utilized in excitation-use light sources in biological fields, with which the presence or location of a substance can be detected by irradiating a substance that has sensitivity to a specific wavelength with light from a nitride semiconductor laser.

Examples of the nitride semiconductor laser element of the present invention and the method for manufacturing this element will now be described in detail through reference to the drawings.

EXAMPLE 1

A nitride semiconductor laser element was formed by the manufacturing method described above. As shown in FIG. 1, the nitride semiconductor laser element thus obtained comprised a first n-type semiconductor layer (Si-doped ($8 \times 10^{17}$/$cm^3$ to $3 \times 10^{18}$/$cm^3$) $Al_{0.02}Ga_{0.98}N$ (3.5 μm thick)), a second n-type semiconductor layer (Si-doped ($2 \times 10^{18}$/$cm^3$ to $1 \times 10^{19}$/$cm^3$) $In_{0.06}Ga_{0.94}N$ (0.15 μm thick)), a third n-type semiconductor layer (superlattice layer of undoped $Al_{0.038}Ga_{0.962}N$ (25 Å thick) and Si-doped ($8 \times 10^{17}$/$cm^3$ to $3 \times 10^{18}$/$cm^3$) GaN (25 Å thick): total 1.2 μm thick), and a fourth n-type semiconductor layer (undoped GaN (0.17 μm thick)) formed as an n-type semiconductor layer 11 on a GaN substrate 10.

Over this was formed an active layer 12 with a multiple quantum well (MQW) structure with a total thickness of 560 Å, in which a barrier layer (140 Å) composed of Si-doped $In_{0.02}Ga_{0.98}N$ and a well layer (70 Å) composed of undoped $In_{0.07}Ga_{0.93}N$ were laminated twice alternately, and a barrier layer was formed over this.

Further, over this were formed a first p-type semiconductor layer (Mg-doped ($1 \times 10^{19}$/$cm^3$ to $1 \times 10^{20}$/$cm^3$) $Al_{0.25}Ga_{0.75}N$ (100 Å thick)), a second p-side nitride semiconductor layer (undoped GaN (0.15 μm thick)), a third p-type semiconductor layer (superlattice layer of undoped $Al_{0.10}Ga_{0.90}N$ (25 Å thick) and Mg-doped ($1.25 \times 10^{19}$/$cm^3$) GaN (25 Å thick): total 0.45 μm thick), and a fourth p-type semiconductor layer (Mg-doped ($1 \times 10^{20}$/$cm^3$) GaN (150 Å thick)) as a p-type semiconductor layer 13.

A ridge was formed on the surface of the p-type semiconductor layer, and on both sides thereof were formed two air gaps 15 in a substantially striped shape with a height of 0.4 μm and a width of 0.2 μm.

Further, a first protective film 16 composed of $ZrO_2$ with a thickness of 550 Å was formed so as to cover these air gaps 15. Also, a p-electrode 17 comprising Ni—Au (100 Å-1500 Å thick) was formed over the protective film 16, and a p pad electrode 19 comprising Ni—Ti—Au (1000 Å-1000 Å-8000 Å thick) was formed via a second protective film 18. An n-electrode 20 comprising Ti—Al (100 Å-1500 Å thick) was formed over the first n-type semiconductor layer.

This nitride semiconductor laser element was formed by the following manufacturing method.

Figure 2A:
FIG. 2a to 2g are simplified cross-sectional process views illustrating the method for manufacturing the nitride semiconductor laser element of the present invention.
Figure 2B:
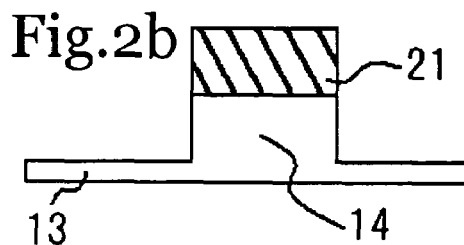

First, as shown in FIG. 2*a*, the nitride semiconductor layer 13 was formed over the substrate according to the method discussed above. Then, etching was performed by RIE so as to expose end faces perpendicular to the striped waveguide region, and resonator faces were formed. A film composed of $SiO_2$ was then formed in a thickness of 0.5 μm with a CVD apparatus, over the nitride semiconductor layer 13. In the formation of this film, $SiH_4$ gas was supplied at 5 sccm, $N_2O$ gas was supplied at 200 sccm, the RF power was at least 100 W, the pressure was 20 Pa, and the substrate temperature was 360° C. Next, using an RIE etching apparatus, the film composed of $SiO_2$ was etched at an $O_2$ gas flow of 6 sccm, a $CHF_3$ gas flow of 100 sccm, an RF power of at least 300 W, and a pressure of 80 mTorr, which formed a first mask pattern 21. Then, as shown in FIG. 2b, using an RIE etching apparatus, the nitride semiconductor layer was etched 0.5 μm at a $Cl_2$ gas flow of 10 sccm, an $SiC_4$ gas flow of 70 sccm, an RF power of at least 150 W, and a pressure of 4 Pa, which formed a ridge 14.

Figure 2C:
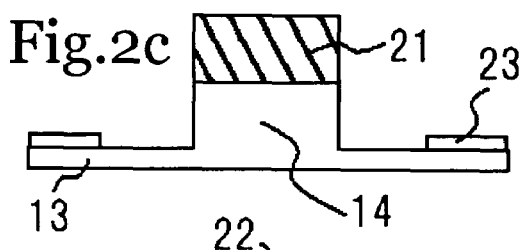

Next, as shown in FIG. 2c, a resist film 23 with a thickness of 1.5 μm was formed over the nitride semiconductor layer 13 at a distance of 0.1 μm from the ridge 14.

Figure 2D:
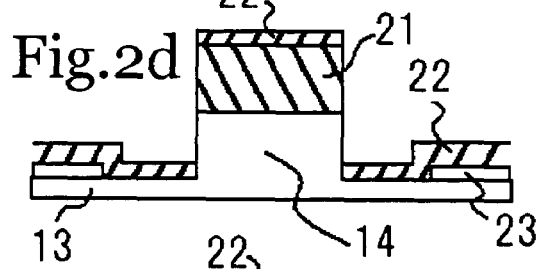

Then, as shown in FIG. 2d, using an ECR apparatus, a film 22 composed of $SiO_2$ was formed in a thickness of 500 Å at an argon gas flow of 20 sccm, an $O_2$ gas flow of 8 sccm, and an RF power of at least 500 W, over the first mask pattern 21, the exposed nitride semiconductor layer 13, and the resist film 23.

Figure 2E:
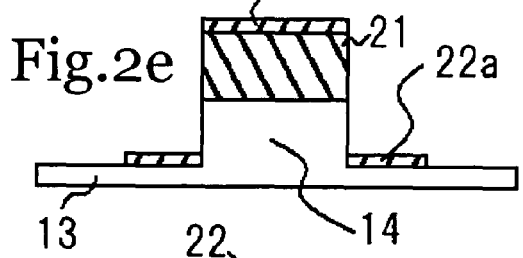
Figure 2E:
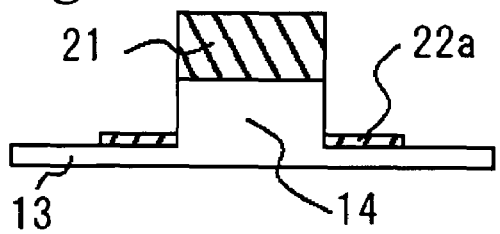

After this, as shown in FIG. 2e, the resist film 23 as well as the film 22 composed of $SiO_2$ and formed over the resist film 23 were removed by lift-off method using a stripper. This formed a second mask pattern 22a at the location on the ridge 14 and an region where the air gap was to be formed.

Figure 2F:
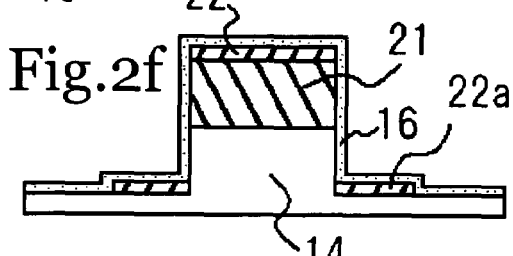

Next, as shown in FIG. 2f, a first protective film 16 composed of $ZrO_2$ was formed in a thickness of 550 Å, using a zirconium target in a magnetron sputtering apparatus, at an argon gas flow of 45 sccm, an $O_2$ gas flow of 10 sccm, an RF power of at least 500 W, and a pressure of 0.2 Pa, so as to cover the ridge 14, the first mask pattern 21, and the second mask pattern 22a.

Figure 2G:
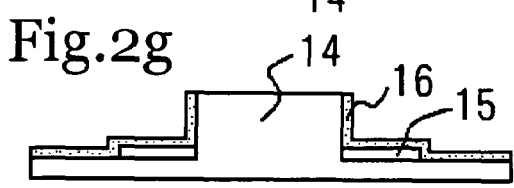

Then, as shown in FIG. 2g, BHF was used to etch away the first mask pattern 21 and the first protective film 16 directly over the first mask pattern 21, and to etch away the second mask pattern 22a under the first protective film 16, which formed the air gap 15 on both sides of the ridge 14.

Electrodes were then formed to obtain a nitride semiconductor laser element in the form of a chip.

The characteristics of the nitride semiconductor laser element obtained above were evaluated. The effective refractive index differential Δn of this element having an air gap (the average of six elements) was 0.007.

As a comparative example, an element was formed with the same structure as the above laser element, except that it had no air gap. The effective refractive index differential Δn of this element was measured and found to be 0.0061.

Figure 3:
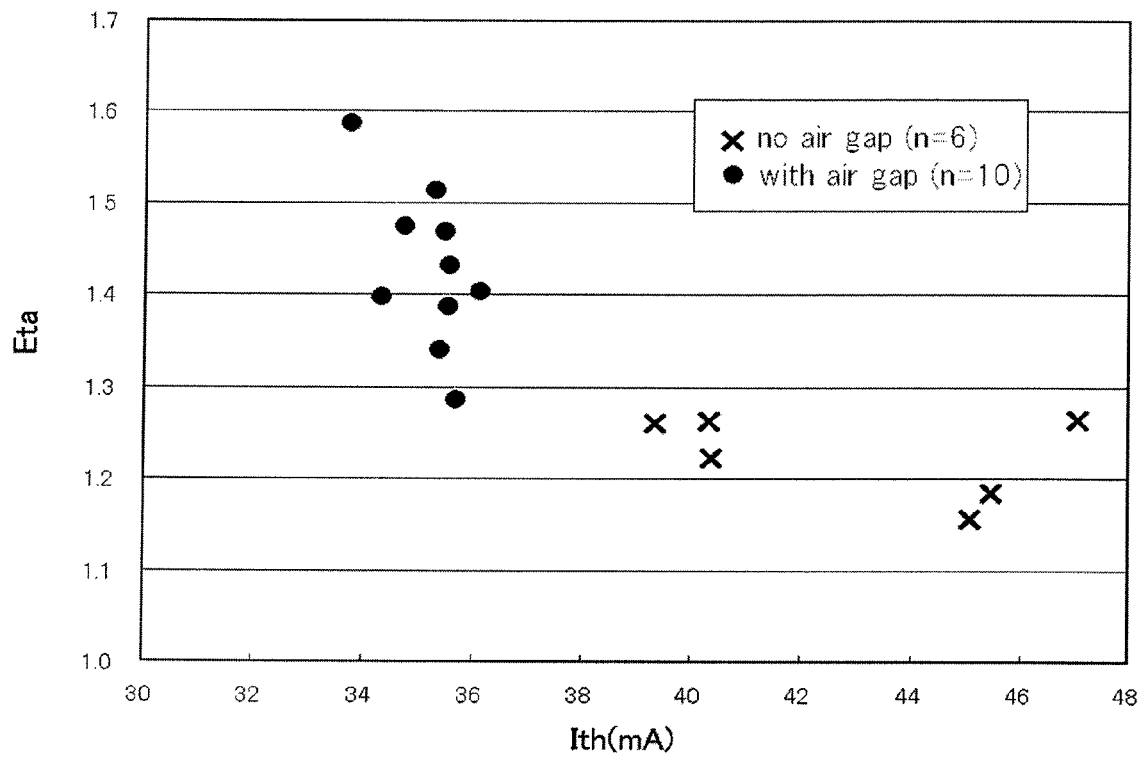
FIG. 3 is a graph illustrating the characteristic evaluation of the laser element in an example.

FIG. 3 shows the results of evaluating the characteristics. It can be seen from FIG. 3 that an element having an air gap has better optical confinement than an element without an air gap. In other words, it can be seen that the air gap lowers the threshold current about 5 to 10 mA, and that Eta is about 0.1 to 0.2 higher.

EXAMPLE 2

The nitride semiconductor laser element of Example 2 was formed in the same manner as in Example 1, except for how the second mask was formed.

To form the second mask, the substrate temperature used in forming the ridge 14 is kept low (70° C. or lower), the ridge 14 was formed as shown in FIG. 2b, and an etching product was deposited as the second mask pattern 22 on both sides of the ridge 14 as shown in FIG. 2e'.

The characteristics of the nitride semiconductor laser element obtained above were evaluated. The nitride semiconductor laser element obtained in Example 2 had about the same characteristics as those in Example 1.

According to the Example, also in FIG. 2d, the film 22 composed of $SiO_2$ is formed in a thicknesses of 100 Å and 200 Å, respectively. Thus, the thicker the film 22 composed of $SiO_2$ is formed, the greater the thickness of growing film at the side surface of the ridge becomes, thereby forming the air gap easily into a shape that is more similar to L-form. Further, the film 22 composed of $SiO_2$ is formed in a thickness of 1000 Å, and the first protective film 16 is formed in a thickness of 1000 Å in FIG. 2f. Thus, the thicker the first protective film is formed, the easier an air gap is formed into L-form.

EXAMPLE 3

The nitride semiconductor laser element of Example 3 was formed by the same manufacturing method as in Example 1.

With the nitride semiconductor laser element thus obtained, as shown in FIG. 6a, a first n-type semiconductor layer (Si-doped ($1 \times 10^{18}/cm^3$ to $1 \times 10^{19}/cm^3$) $Al_{0.03}Ga_{0.97}N$ (2 μm thick)) and a second n-type semiconductor layer (undoped GaN (0.19 μm thick)) were formed as the n-type semiconductor layer 11 over the GaN substrate 10.

Over this was formed an active layer 12 with a multiple quantum well (MQW) structure with a total thickness of 560 Å, in which a barrier layer (140 Å) composed of Si-doped $In_{0.02}Ga_{0.98}N$ and a well layer (70 Å) composed of undoped $In_{0.07}Ga_{0.93}N$ were laminated twice alternately, and a barrier layer was formed over this.

Further, over this were formed a first p-type semiconductor layer (Mg-doped ($1 \times 10^{19}/cm^3$ to $1 \times 10^{20}/cm^3$) $Al_{0.25}Ga_{0.75}N$ (100 Å thick), a second p-side nitride semiconductor layer (undoped GaN (0.125 μm thick)), a third p-type semiconductor layer (superlattice layer with a total thickness of 0.45 μm, composed of undoped $Al_{0.10}Ga_{0.90}N$ (25 Å) and Mg-doped GaN (25 Å)), and a fourth p-type semiconductor layer (Mg-doped ($1 \times 10^{20}/cm^3$) GaN (150 Å thick)) as the p-type semiconductor layer 13.

Figure 6B:
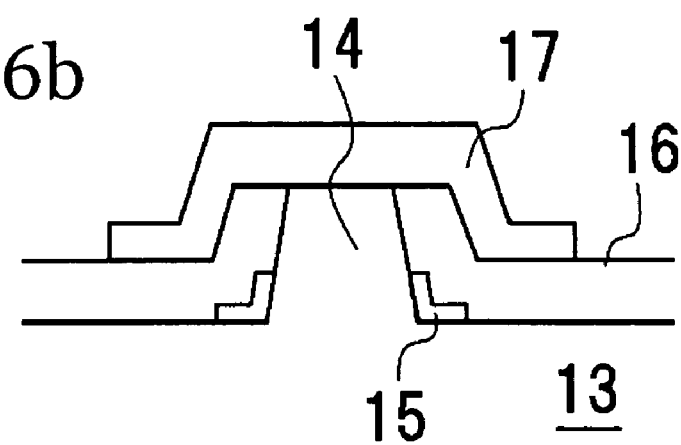

A ridge 14 was formed on the surface of the p-type semiconductor layer, and on both sides thereof were formed two air gaps 15 in a substantially striped shape with a height of 0.4 μm and a width of 0.2 μm, as shown in FIG. 6b.

Further, a first protective film 16 composed of $ZrO_2$ and with a thickness of 1000 Å was formed so as to cover these air gaps 15. Also, a p-electrode 17 comprising Ni—Au (100 Å-1500 Å thick) was formed over the protective film 16, and a p pad electrode 19 comprising Ni—Ti—Au (1000 Å-1000 Å-8000 Å thick) was formed via a second protective film 18. An n-electrode 20 comprising V—Pt—Au (100 Å-2000 Å-3000 Å thick) was formed on the back side of the nitride semiconductor substrate 10.

The characteristics of the nitride semiconductor laser element obtained above were evaluated. The nitride semiconductor laser element obtained in Example 3 had about the same characteristics as those in Example 1.

EXAMPLE 4

The nitride semiconductor laser element of Example 4 had the same structure as the nitride semiconductor laser element in Example 3, and was formed by the same manufacturing method as in Example 2.

The characteristics of the nitride semiconductor laser element obtained above were evaluated. The nitride semiconductor laser element obtained in Example 4 had about the same characteristics as those in Example 1.

What is claim is:

1. A nitride semiconductor laser element, comprising
   a substrate,
   a nitride semiconductor layer laminated over said substrate and having a ridge on its surface, and an electrode, wherein a first protective film is formed so that an air gap is located between the first protective film and at least part of the region extending from the side of the ridge to the surface of the nitride semiconductor layer on both sides of said ridge.

2. The nitride semiconductor laser element according to claim 1, wherein the air gap is present in striped form on the sides of the ridge.

3. The nitride semiconductor laser element according to claim 1, wherein the air gap height $h_1$ is at least 1/50 and less than 1 with respect to the height $h_2$ of the ridge.

4. The nitride semiconductor laser element according to claim 1, wherein the area $S_1$ of a cross section of the air gap that is perpendicular to the stripe direction of the ridge is from 0.0001 to 1 μm$^2$.

5. The nitride semiconductor laser element according to claim 1, wherein the first protective film has a lower refractive index than the nitride semiconductor layer.

6. The nitride semiconductor laser element according to claim 1, wherein the electrode is formed over the nitride semiconductor layer and the first protective film.

7. The nitride semiconductor laser element according to claim 1, further comprising a second protective film over the first protective film.

8. A nitride semiconductor laser element, comprising
a substrate,
a nitride semiconductor layer laminated over said substrate and having a ridge on its surface, and
an electrode,
wherein a first protective film and an electrode are formed in this order with an air gap being located between the first protective film and at least part of the region extending from the side of the ridge to the surface of the nitride semiconductor layer on both sides of the ridge.

9. The nitride semiconductor laser element according to claim 8, wherein the air gap is present in striped form on the sides of the ridge.

10. The nitride semiconductor laser element according to claim 8, wherein the air gap height $h_1$ is at least 1/50 and less than 1 with respect to the height $h_2$ of the ridge.

11. The nitride semiconductor laser element according to claim 8, wherein the area $S_1$ of a cross section of the air gap that is perpendicular to the stripe direction of the ridge is from 0.0001 to 1 μm$^2$.

12. The nitride semiconductor laser element according to claim 8, wherein the first protective film has a lower refractive index than the nitride semiconductor layer.

13. The nitride semiconductor laser element according to claim 8, wherein the electrode is formed over the nitride semiconductor layer and the first protective film.

14. The nitride semiconductor laser element according to claim 8, further comprising a second protective film over the first protective film.

15. A method for manufacturing a nitride semiconductor laser element, comprising the steps of:
forming a nitride semiconductor layer over a substrate;
forming a first mask pattern over said nitride semiconductor layer and using said first mask pattern for etching, thereby forming a ridge;
forming a second mask pattern on both sides of the ridge;
forming a first protective film over the nitride semiconductor layer exposed after the formation of the first mask pattern, the second mask pattern, and the ridge; and
removing the first protective film present on the first mask pattern, the first mask pattern, and the second mask pattern, thereby forming an air gap between the first protective film and at least part of the region extending from both sides of the ridge to the surface of the nitride semiconductor layer on both sides of the ridge.

16. The method for manufacturing a nitride semiconductor laser element according to claim 15, wherein the first mask pattern is thicker than the second mask pattern.

17. The method for manufacturing a nitride semiconductor laser element according to claim 15, wherein the second mask pattern is formed further on the first mask pattern.

18. The method for manufacturing a nitride semiconductor laser element according to claim 15, wherein the second mask pattern is formed from the same material as the first mask pattern.

19. The method for manufacturing a nitride semiconductor laser element according to claim 15, wherein the second mask pattern is formed by depositing the etching product during the formation of the ridge.

* * * * *